(12) United States Patent
Gawai et al.

(10) Patent No.: US 11,990,370 B2
(45) Date of Patent: *May 21, 2024

(54) METHODS FOR FORMING CONDUCTIVE VIAS, AND ASSOCIATED DEVICES AND SYSTEMS

(71) Applicant: Micron Technology, Inc., Boise, ID (US)

(72) Inventors: Trupti D. Gawai, Boise, ID (US);
David S. Pratt, Meridian, ID (US);
Ahmed M. Elsied, Boise, ID (US);
David A. Kewley, Boise, ID (US); Dale W. Collins, Boise, ID (US); Raju Ahmed, Boise, ID (US); Chelsea M. Jordan, Boise, ID (US); Radhakrishna Kotti, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/048,633

(22) Filed: Oct. 21, 2022

(65) Prior Publication Data
US 2023/0113573 A1    Apr. 13, 2023

Related U.S. Application Data

(63) Continuation of application No. 17/136,287, filed on Dec. 29, 2020, now Pat. No. 11,515,204.

(51) Int. Cl.
*H01L 21/768* (2006.01)
*H01L 23/522* (2006.01)
*H01L 23/528* (2006.01)

(52) U.S. Cl.
CPC .. *H01L 21/76883* (2013.01); *H01L 21/76816* (2013.01); *H01L 23/5226* (2013.01); *H01L 23/5283* (2013.01)

(58) Field of Classification Search
CPC ......... H01L 21/76883; H01L 21/76816; H01L 23/5226; H01L 23/5283
See application file for complete search history.

(56) References Cited

U.S. PATENT DOCUMENTS

| | | | |
|---|---|---|---|
| 5,472,912 | A | 12/1995 | Miller |
| 10,283,548 | B1 | 5/2019 | Ku et al. |

(Continued)

FOREIGN PATENT DOCUMENTS

| | | |
|---|---|---|
| JP | 2017037929 A | 2/2017 |
| KR | 20080069811 A | 7/2008 |

(Continued)

OTHER PUBLICATIONS

International Search Report and Written Opinion dated Feb. 23, 2022 for International Patent Application No. PCT/US2021/058482, 9 pages.

(Continued)

*Primary Examiner* — Karen Kusumakar
(74) *Attorney, Agent, or Firm* — Perkins Coie LLP (57) ABSTRACT

Methods of manufacturing semiconductor devices, and associated systems and devices, are disclosed herein. In some embodiments, a method of manufacturing a semiconductor device includes forming an opening in an electrically insulative material at least partially over a first electrically conductive feature and a second electrically conductive feature. The method can further include forming a ring of electrically conductive material around a sidewall of the insulative material defining the opening, wherein the ring of electrically conductive material includes (a) a first via portion over the first electrically conductive feature, (b) a second via portion over the second electrically conductive feature, and (c) connecting portions extending between the first and second via portions. Finally, the method can include removing the connecting portions of the ring of electrically (Continued)

conductive material to electrically isolate the first via portion from the second via portion.

20 Claims, 10 Drawing Sheets

(56) References Cited

U.S. PATENT DOCUMENTS

| | | | |
|---|---|---|---|
| 2004/0198036 A1 | 10/2004 | Nakamura | |
| 2011/0139497 A1 | 6/2011 | Li et al. | |
| 2011/0171827 A1 | 7/2011 | Farooq et al. | |
| 2014/0070426 A1 | 3/2014 | Park et al. | |
| 2016/0358859 A1* | 12/2016 | Murray | H01L 23/53233 |
| 2019/0096833 A1 | 3/2019 | Lim et al. | |
| 2022/0208606 A1 | 6/2022 | Gawai et al. | |
| 2022/0336277 A1 | 10/2022 | Gawai et al. | |

FOREIGN PATENT DOCUMENTS

| | | |
|---|---|---|
| KR | 20190015097 A | 2/2019 |
| TW | 202038383 A | 10/2020 |
| TW | 202109766 A | 3/2021 |

OTHER PUBLICATIONS

Office Action dated Jun. 29, 2022 for Taiwanese Patent Application No. 110143648, 9 pages (with translation).
Office Action and Search Report dated Jan. 30, 2023 for Taiwanese Patent Application No. 111109532, 7 pages (with translation).

* cited by examiner

METHODS FOR FORMING CONDUCTIVE VIAS, AND ASSOCIATED DEVICES AND SYSTEMS

CROSS-REFERENCE TO RELATED APPLICATION(S)

This application is a continuation of U.S. patent application Ser. No. 17/136,287, titled "METHODS FOR FORMING CONDUCTIVE VIAS, AND ASSOCIATED DEVICES AND SYSTEMS," filed Dec. 29, 2020, now U.S. Pat. No. 11,515,204, which is incorporated herein by reference in its entirety.

TECHNICAL FIELD

The present technology generally relates to semiconductor devices and methods for manufacturing semiconductor devices, and more particularly relates to methods for forming conductive vias in a semiconductor device.

BACKGROUND

Memory devices are widely used to store information related to various electronic devices such as computers, wireless communication devices, cameras, digital displays, and the like. Information is stored by programing different states of a memory cell. Various types of memory devices exist, such as non-volatile memory devices (e.g., NAND Flash memory devices) and volatile memory devices (e.g., dynamic RAM (DRAM), synchronous dynamic RAM (SDRAM), and the like).

Improving memory devices, generally, may include increasing memory cell density, increasing read/write speeds or otherwise reducing operational latency, increasing reliability, increasing data retention, reducing power consumption, or reducing manufacturing costs, among other metrics. One way of reducing manufacturing costs is to improve manufacturing processes to increase the margin of successfully manufactured devices. Manufacturers can improve the manufacturing margin by implementing processes that, for example, increase the consistency or tolerance off manufacturing steps (e.g., removal or deposition of materials), improve the scale of manufacturing, and so on.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Embodiments of the present technology include methods of manufacturing semiconductor devices, such as memory devices, and associated devices and systems. In several of the embodiments described below, for example, a method of manufacturing a semiconductor device includes forming an opening in an electrically insulative material at least partially over a first electrically conductive feature and a second electrically conductive feature. The first and second electrically conductive features can be metal lines, such as word and/or bit lines of a memory device. The electrically insulative material can include a sidewall at least partially defining the opening. The method can further include forming a ring of electrically conductive material on/about the sidewall of the insulative material. The ring of conductive material can include (a) a first via portion over the first electrically conductive feature, (b) a second via portion over the second electrically conductive feature, and (c) connecting portions extending between the first and second via portions. In some embodiments, the ring can have a generally rectangular shape. The method can further include removing the connecting portions of the ring to electrically isolate the first via portion from the second via portion. For example, channels can be etched along the insulative material to remove the connecting portions of the ring while leaving the first and second via portions.

In some aspects of the present technology, the conductive via portions can be formed at a lower cost and/or with higher margin than conventional techniques for forming conductive vias. For example, the opening formed in the insulative material can be significantly larger (e.g., having a lower aspect ratio) than the subsequently formed via portions. Accordingly, the opening can be formed via an etching or other process that is less precise—and thus more reliable and lower cost—than conventional methods that etch high aspect ratio holes that correspond to the subsequent dimensions of the conductive vias formed therein. In additional aspects of the present technology, the thickness of the conductive via portions can be precisely controlled and made arbitrarily small via a selected deposition technique used to deposit the conductive material along the sidewall of the insulative material.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-4. For example, some details of memory devices well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-4.

FIGS. 1A-1H are enlarged partially-schematic top views illustrating various stages in a method of manufacturing a semiconductor device 100 (e.g., a memory device) in accordance with embodiments of the present technology. FIGS. 2A-2H are enlarged side cross-sectional views of the semiconductor device 100 taken along the lines 2A-2A through 2H-2H shown in FIGS. 1A-1H, respectively, in accordance with embodiments of the present technology. Generally, the semiconductor device 100 can be manufactured, for example, as a discrete device or as part of a larger wafer or panel. In wafer-level or panel-level manufacturing, a larger structure is formed before being singulated to form a plurality of individual structures. For ease of explanation and understanding, FIGS. 1A-2H illustrate the fabrication of a portion of a single semiconductor device 100. However, one skilled in the art will readily understand that the fabrication of the semiconductor device 100 can be scaled to the wafer and/or panel level—that is, to include many more components so as to be capable of being singulated into two or more semiconductor devices—while including similar features and using similar processes as described herein.

Figure 1A:
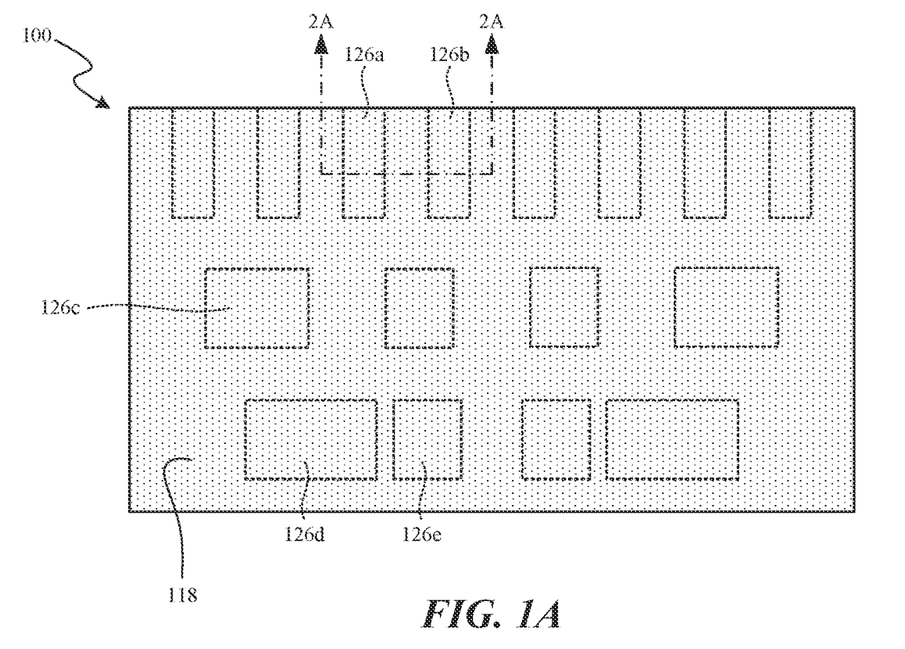
FIGS. 1A-1H are enlarged partially-schematic top views illustrating various stages in a method of manufacturing a semiconductor device in accordance with embodiments of the present technology.
Figure 1B:
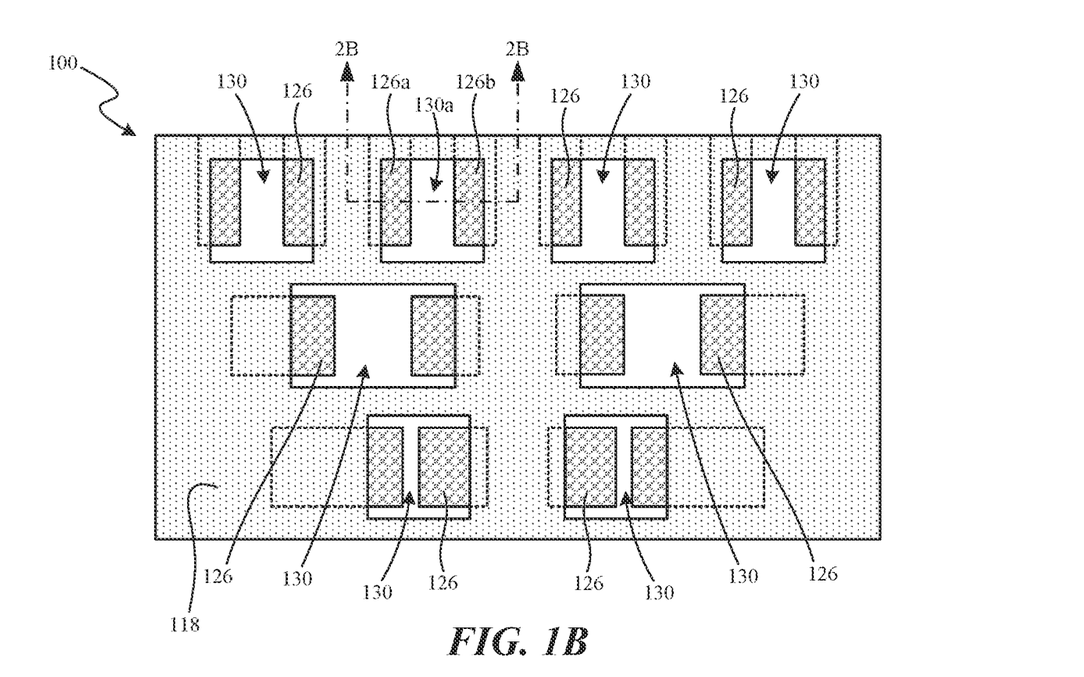
Figure 1C:
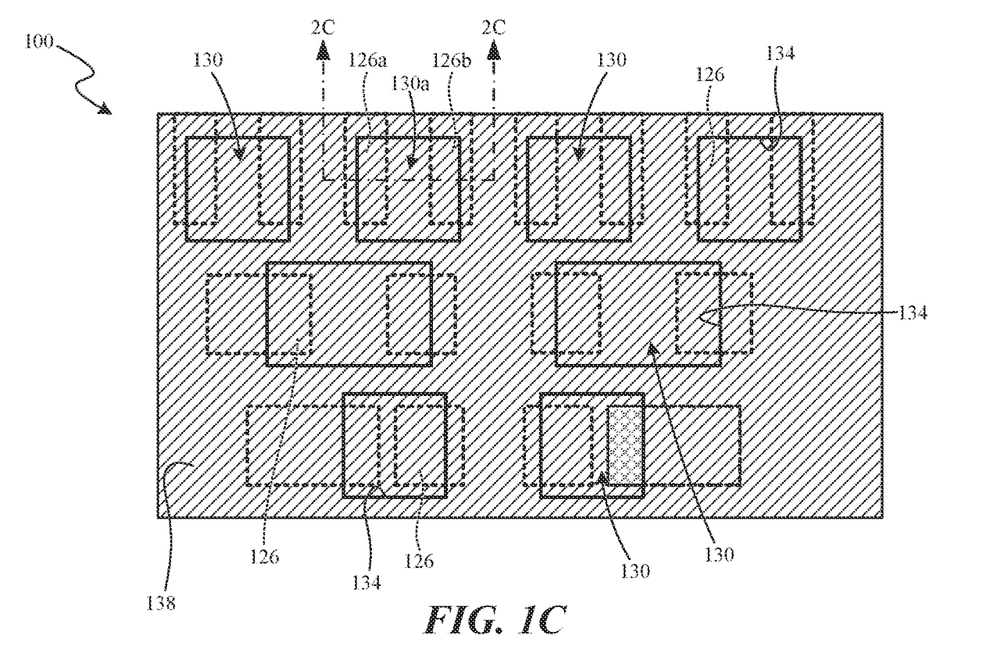
Figure 1D:
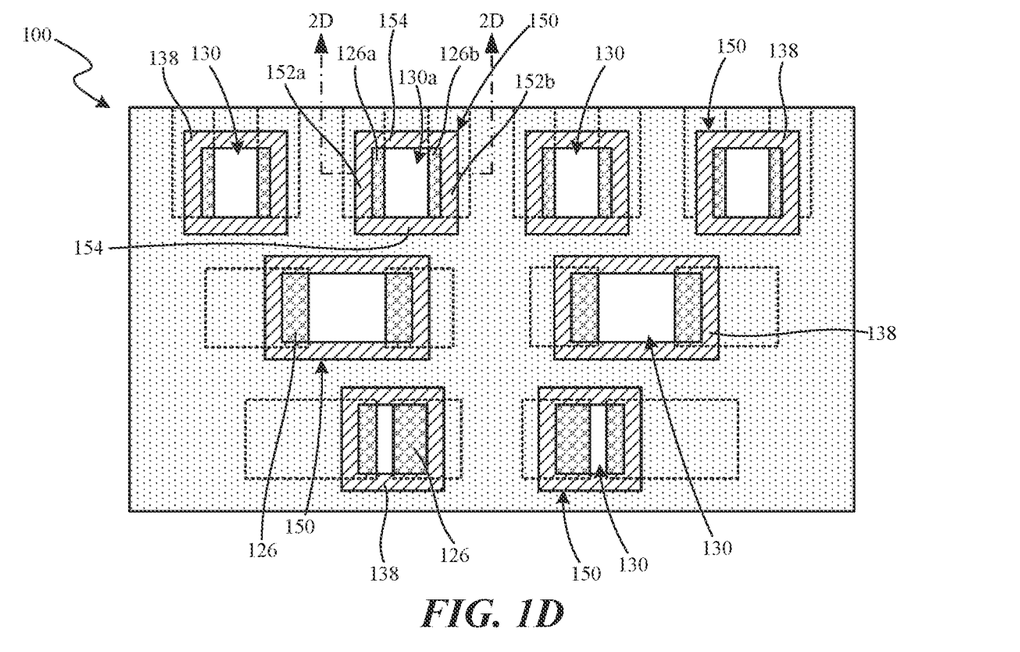
Figure 1E:
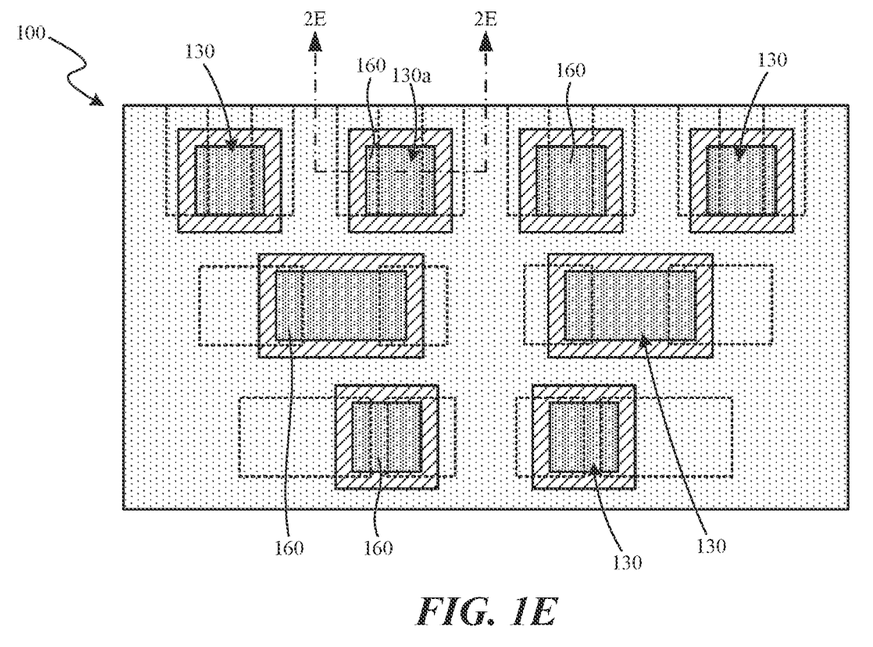
Figure 1F:
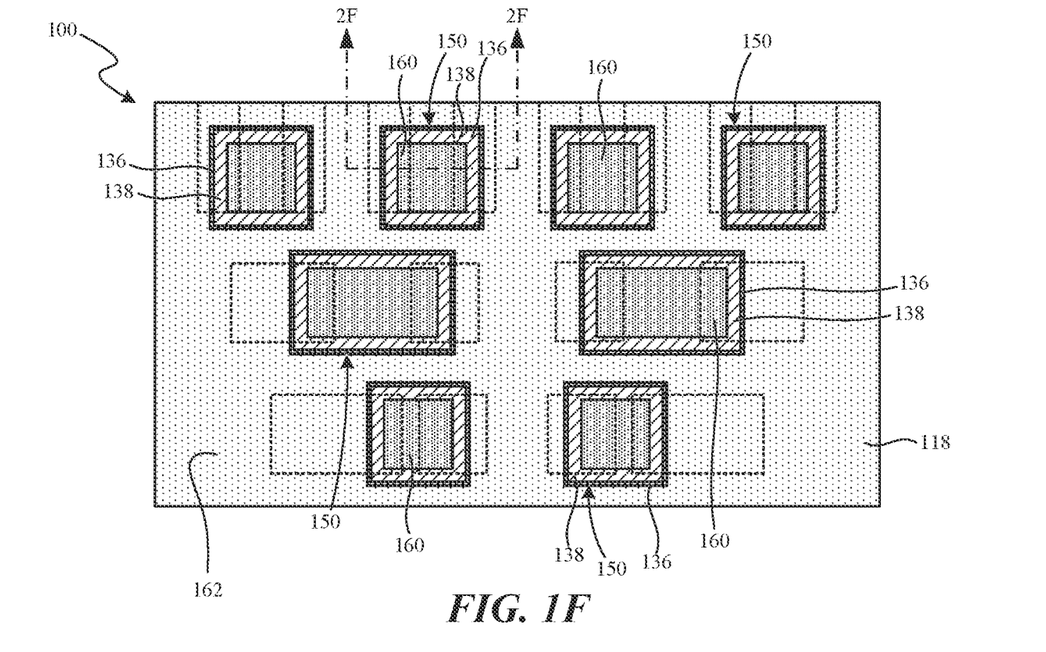
Figure 1G:
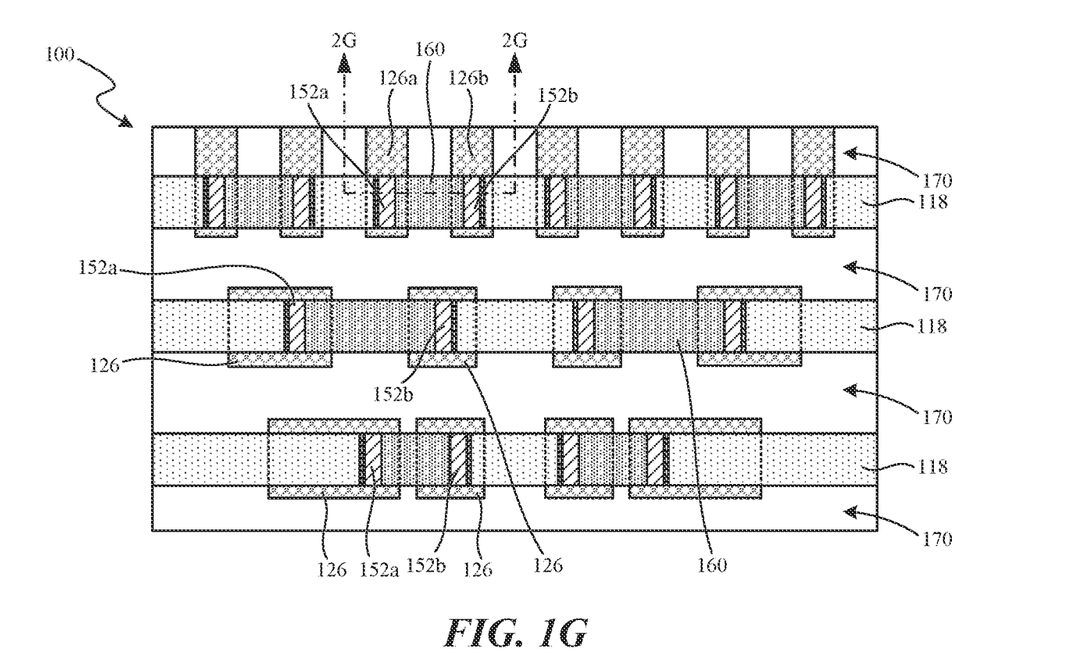
Figure 1H:
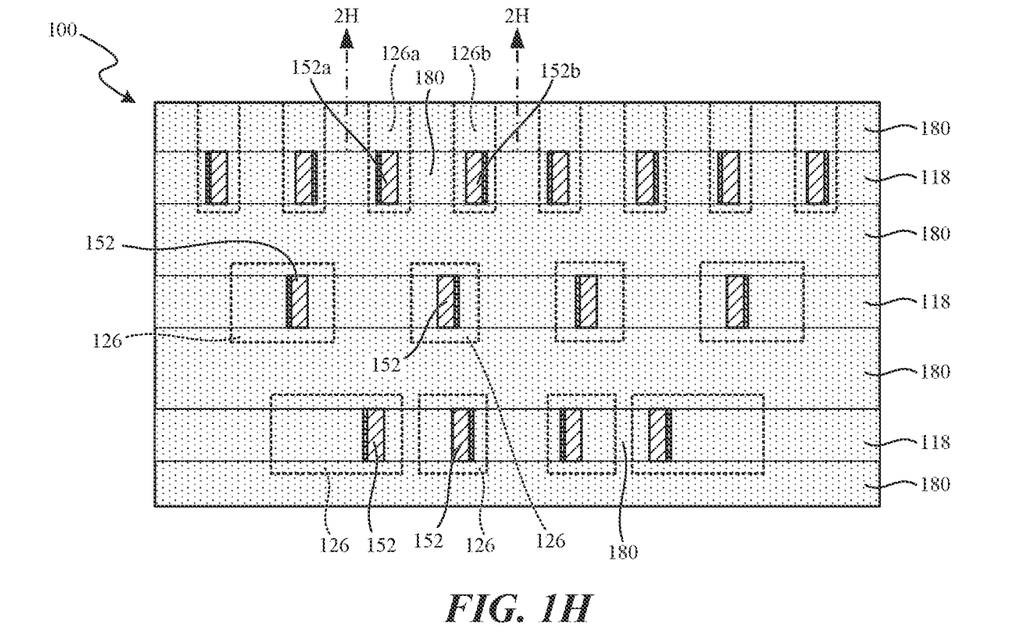
Figure 2A:
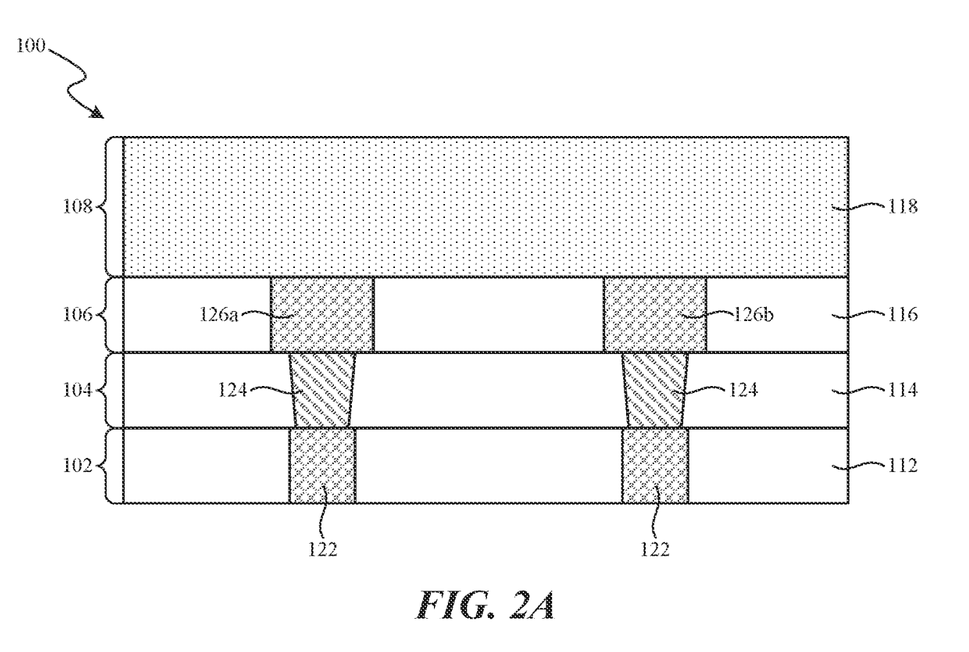
FIGS. 2A-2H are enlarged side cross-sectional views of the semiconductor device of FIGS. 1A-1H taken along the lines 2A-2A through 2H-2H shown in FIGS. 1A-1H, respectively, in accordance with embodiments of the present technology.

FIGS. 1A and 2A illustrate the semiconductor device 100 after formation of (i) a first layer 102 including a first insulative material 112 and first conductive features 122 (e.g., a first metallization layer), (ii) a second layer 104 over the first layer 102 and including a second insulative material 114 and conductive vias 124 electrically coupled/connected to corresponding ones of the first conductive features 122, (iii) a third layer 106 over the second layer 104 and including a third insulative material 116 and second conductive features 126 (e.g., a second metallization layer including an individually identified first one of the second conductive features 126a and a second one of the second conductive features 126b) electrically coupled/connected to corresponding ones of the conductive vias 124, and (iv) a fourth layer 108 over the third layer 106 and including a fourth insulative material 118. The second conductive features 126 are fully or partially obscured in FIGS. 1A-1H and therefore shown at least partially schematically.

The first through fourth insulative materials 112-118 (collectively "insulative materials 112-118") can comprise one or more electrically-insulative materials such as a passivation material, dielectric material, oxide (e.g., silicon oxide), and/or tetraethyl orthosilicate (TEOS), and the insulative materials 112-118 can be the same or different. In some embodiments, the fourth insulative material 118 comprises TEOS and has a thickness of between about 2000-5000 angstroms (e.g., about 3500 angstroms). The thicknesses of the first through fourth layers 102-108 (collectively "layers 102-108") can be the same or different. The first conductive features 122, the conductive vias 124, and the second conductive features 126 can comprise a metal such as tungsten, a metal alloy, and/or a conductive-metal containing material, and can have the same or varying dimensions (e.g., widths, diameters) and/or arrangements. In some embodiments, the first conductive features 122 comprise copper and the second conductive features 126 comprise tungsten.

The first conductive features 122 can be electrically coupled to one or more circuit elements (e.g., wires, traces, interconnects, transistors; not shown) that can be formed in/on a substrate (not shown). The circuit elements can include, for example, memory circuits (e.g., dynamic random memory (DRAM) or other type of memory circuits), controller circuits (e.g., DRAM controller circuits), logic circuits, and/or other circuits. In some embodiments, the first conductive features 122 are electrically coupled to one or more complementary metal-oxide-semiconductor (CMOS) circuits.

The second conductive features 126 can be metal lines, contacts, traces, or the like extending through/along the third layer 106. In some embodiments, for example, the second conductive features 126 can be word lines and/or bit lines electrically coupled to one or memory elements (not shown). As best seen in FIG. 1A, the second conductive features 126 can have different planform shapes and/or dimensions. In the illustrated embodiment, for example, the second conductive features 126 each have a rectangular shape. However, in the illustrated embodiment the first and second ones of the second conductive features 126a, b have the same dimensions, while a third one of the second conductive features 126c, a fourth one of the second conductive features 126d, a fifth one of the second conductive features 126e, and so on have different dimensions. In the illustrated embodiment, the second conductive features 126 are generally arranged in rows. In other embodiments, the second conductive features 126 can have different shapes (e.g., circular, rectilinear, polygonal, irregular, and so on), different sizes, and/or can be arranged differently (e.g., in more or fewer rows, irregularly, in a grid, spaced closer or farther apart from one another).

Figure 2B:
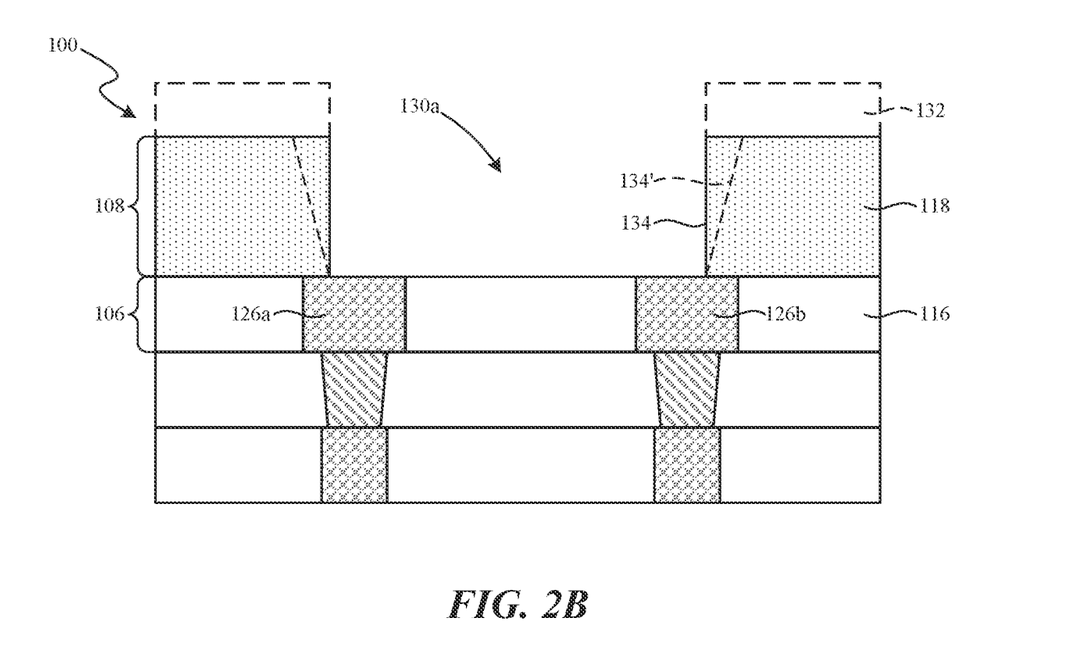

FIGS. 1B and 2B illustrate the semiconductor device 100 after forming openings 130 (e.g., including an individually identified first opening 130a) through the fourth insulative material 118 of the fourth layer 108 to expose a portion of two or more of the second conductive features 126 in each of the openings 130. For example, a portion of the first one of the second conductive features 126a and a portion of the second one of the second conductive features 126b are exposed in the first opening 130a. A photolithography, etching, punching, chopping, masking, and/or other suitable process can be used to remove portions of the fourth insulative material 118 to form the openings 130. In some embodiments, one or more additional layers 132 (shown schematically) can optionally be formed over the fourth layer 108 before forming the openings 130. The additional layers 132 can comprise one or more resist, antireflective coating (ARC), backside antireflective coating (BARC), carbon, and/or other suitable layers known in the art of photolithography. In the illustrated embodiment, a portion of adjacent ones of the second conductive features 126 are exposed in corresponding ones of the openings 130. In other embodiments, some or all the openings 130 can be formed over (i) the entire footprint of one or more of the second conductive features 126, (ii) more or less of the area of the second conductive features 126, (iii) more than two of the second conductive features 126, and/or (iv) non-adjacent ones of the second conductive features 126.

Referring to FIG. 2B, in some embodiments the fourth insulative material 118 includes a generally vertical sidewall 134 at/defining each of the openings 130. In other embodiments, the sidewalls 134 can be angled/slanted (e.g., relative to an upper surface of the third layer 106) as shown in dashed lines in FIG. 2B and identified by reference numeral 134'. In such embodiments, the openings 130 can have a tapered shape including, for example, a cross-sectional dimension (e.g., radius, diameter, area) that decreases in a direction toward the third layer 106. Some such embodiments are described in further detail with reference to FIG. 3.

Figure 2C:
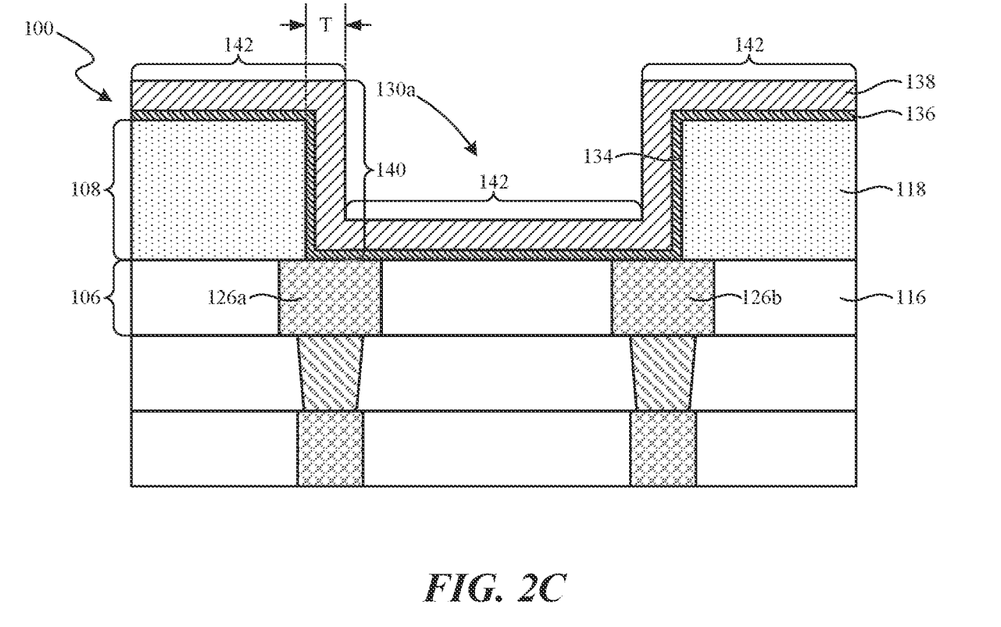

FIGS. 1C and 2C illustrate the semiconductor device 100 after forming/depositing (i) a seed layer 136 over the fourth insulative material 118 and in the openings 130 over the third layer 106 and (ii) a metal layer 138 over the seed layer 136. The metal layer 138 can comprise a metal such as tungsten, copper, silver, aluminum, a metal alloy, a conductive-metal containing material, or the like, and is electrically coupled to the portions of the second conductive features 126 exposed in the openings 130 (e.g., via the seed layer 136). In some embodiments, the seed layer 136 can comprise titanium nitride (TiN). The seed layer 136 and the metal layer 138 can be formed via sputtering, chemical vapor deposition, physical vapor deposition, atomic layer deposition, spin coating, electroplating, electro-less plating, and/or another suitable deposition technique. In some embodiments, the seed layer 136 and the metal layer 138 can be formed only in the openings 130 and not over the fourth insulative material 118. In some embodiments, the seed layer 136 can be omitted or another suitable metallization structure can be formed.

Referring to FIG. 2C, the seed layer 136 and the metal layer 138 in each of the openings 130 can include a vertical portion 140 formed along the sidewall 134 of the opening 130 and a horizontal portion 142 formed over (i) the fourth insulative material 118 (e.g., an upper surface of the fourth insulative material 118) and (ii) the third layer 106 exposed in the opening 130. As described in detail below, the vertical portion 140 can be patterned to form individual conductive vias electrically coupled to the second conductive features 126 in the third layer 106. Accordingly, a thickness T of the seed layer 136 and the metal layer 138 can be selected based on a desired final thickness of the conductive vias. In some embodiments, the thickness T can be less than 100 nanometers, less than 10 nanometers, less than 5 nanometers, less than 1 nanometer, or greater than 100 nanometers.

Figure 2D:
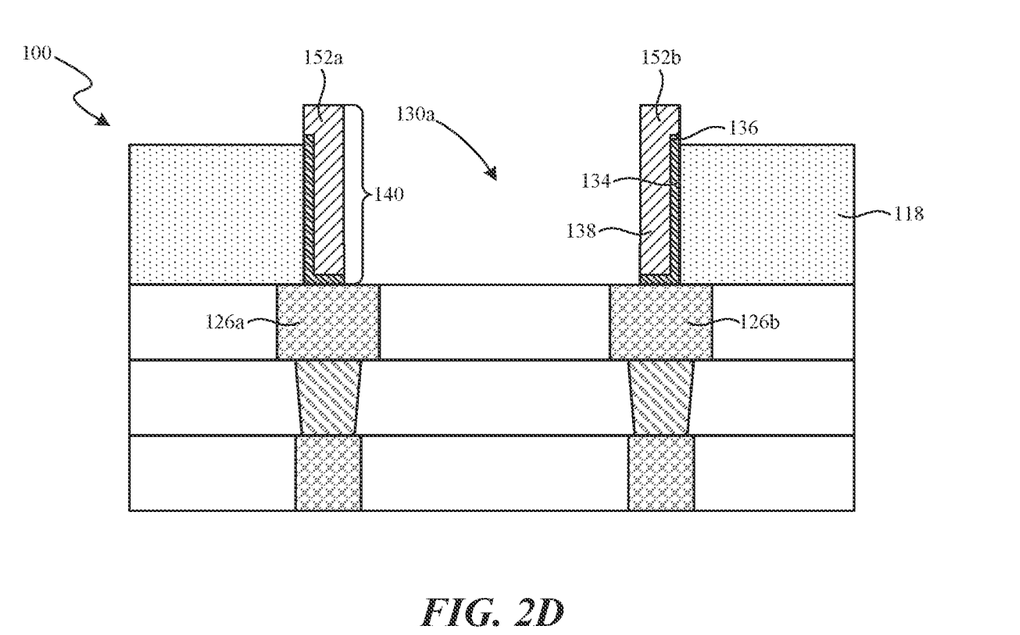

FIGS. 1D and 2D illustrate the semiconductor device 100 after removing the horizontal portions 142 (FIG. 2C) of the seed layer 136 and the metal layer 138 to leave only the vertical portions 140. In some embodiments, a photolithography, punching, plasma etching, wet etching, and/or other suitable process can be used to remove the horizontal portions 142. In some embodiments, the horizontal portions 142 can be removed using a straight punch process. As best seen in FIG. 1D, after removing the horizontal portions 142, the seed layer 136 and the metal layer 138 can form a plurality of rings 150 extending along/about the sidewalls 134 of corresponding ones of the openings 130.

With reference to the ring 150 formed in the first opening 130a, the rings 150 can each include via portions 152 (e.g., first or vertical side or edge portions; identified individually as a first via portion 152a and a second via portion 152b) each positioned at least partially over a corresponding one of the second conductive features 126. Specifically, the first via portion 152a can be positioned partially over the first one of the second conductive features 126a and the second via portion 152b can be positioned partially over the second one of the second conductive features 126b. Referring to FIG. 1D, the rings 150 can further include connecting portions 154 (e.g., second or horizontal side or edge portions) extending between and connecting the via portions 152. In the illustrated embodiment, the rings 150 have a generally rectangular shape formed by the opposing via portions 152 and the opposing connecting portions 154. In other embodiments, the rings 150 can have other shapes determined by, for example, the shape and dimensions of the openings 130.

Figure 2E:
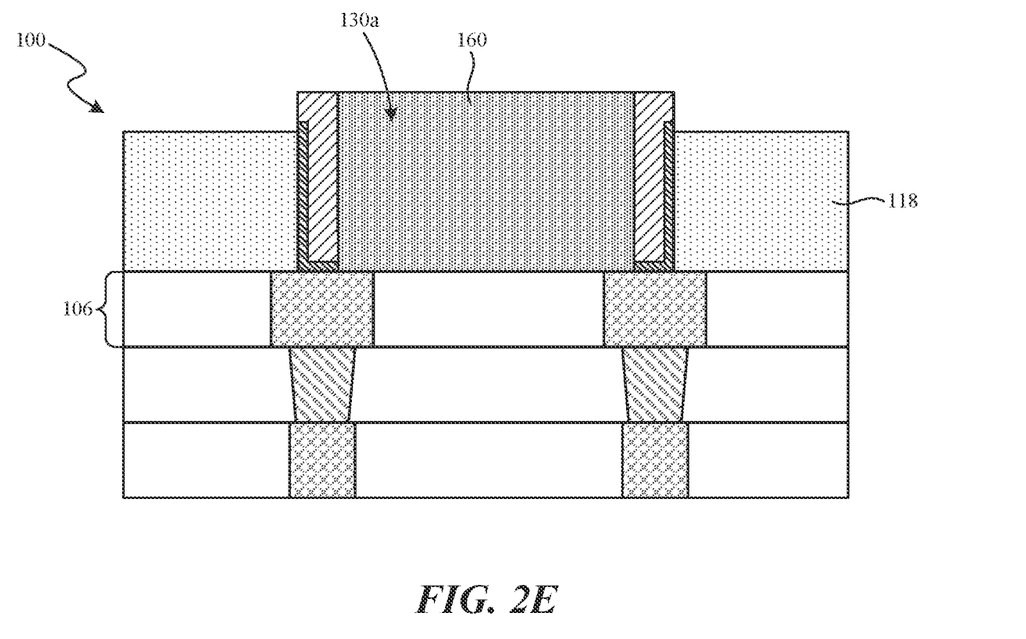

FIGS. 1E and 2E illustrate the semiconductor device 100 after depositing an under layer 160 in the openings 130 over the third layer 106. The under layer 160 can comprise an oxide, a photoresist material, carbon-based spin on material, and/or another electrically-insulative material. In some embodiments, the under layer 160 is a sacrificial material configured to be removed during subsequent downstream processing steps. In other embodiments, the under layer 160 is configured to remain in the semiconductor device 100 after manufacturing and therefore can be, for example, the same material as the fourth insulative material 118. The under layer 160 can be deposited via a spin-on process or another suitable deposition process.

Figure 2F:
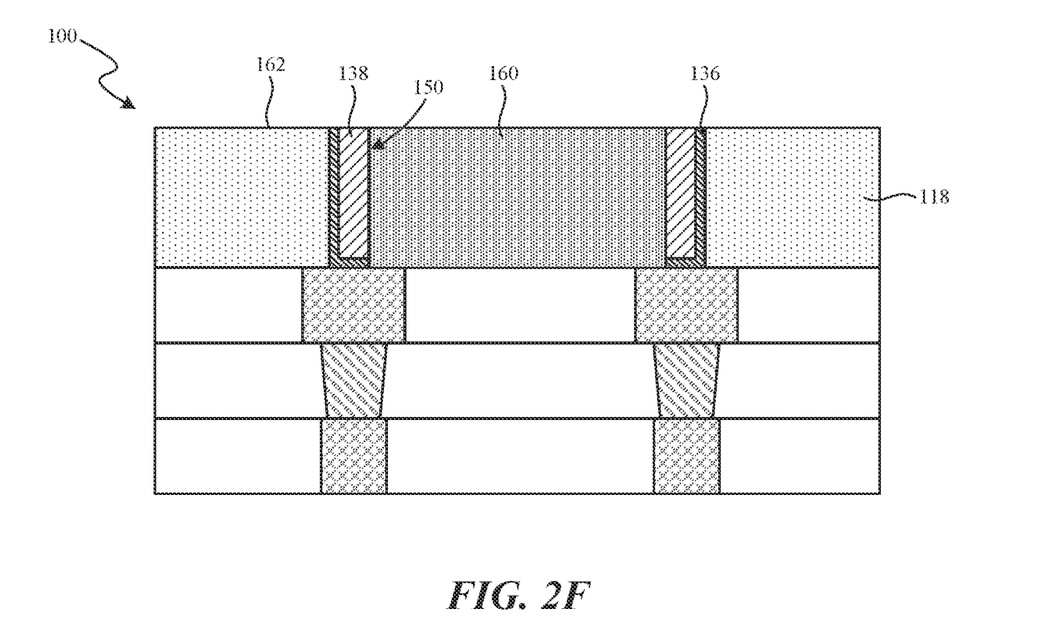

FIGS. 1F and 2F illustrate the semiconductor device 100 after planarizing an upper surface 162 of the semiconductor device 100 including (i) the under layer 160 and (ii) the rings 150 formed from the seed layer 136 and the metal layer 138. In some embodiments, the upper surface 162 can be planarized/polished to remove portions of the under layer 160 and the rings 150 using plasma etching, wet etching, chemical-mechanical planarization (CMP), buffing, and/or other suitable techniques.

Figure 2G:
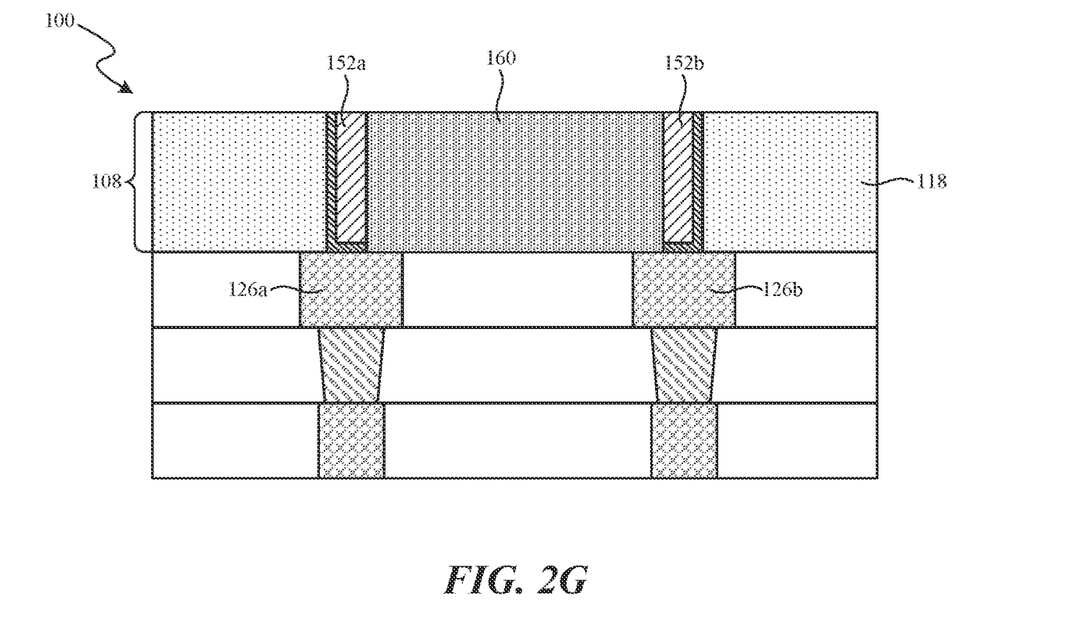

FIGS. 1G and 2G illustrate the semiconductor device 100 after removing portions of the rings 150 (FIGS. 1F and 2F) and the fourth insulative material 118 in the fourth layer 108 to form channels 170. More specifically, with additional reference to FIGS. 1D and 2D, the channels 170 can be formed along the semiconductor device 100 to remove the connecting portions 154 of the rings 150—thereby electrically disconnecting the via portions 152 and leaving all or a portion of the via portions 152 on and electrically coupled to corresponding ones of the second conductive features 126. In the illustrated embodiment, the channels 170 are formed to extend (i) generally parallel to one another, (ii) in the same direction as the (e.g., elongate) connecting portions 154, and (iii) over multiple ones of the connecting portions 154 including, for example, the connecting portions 154 of multiple vertically and horizontally adjacent ones of the rings 150. That is, the channels 170 are formed to remove the connecting edges of the rings 150 to electrically separate the via portions 152 of each of the rings 150.

In other embodiments, the channels 170 can have different shapes, dimensions, and/or orientations based on, for example, the layout of the rings 150 and the second conductive features 126. For example, some or all the channels 170 can be formed over/on (i) only a single one of the connecting portions 154 (e.g., rather than multiple adjacent or linearly aligned ones of the connecting portions) and/or (ii) non-adjacent and/or non-aligned ones of the connecting portions 154. The channels 170 can be formed using a photolithography, etching, punching, chopping, masking, and/or other suitable process to remove portions of the fourth layer 108.

Figure 2H:
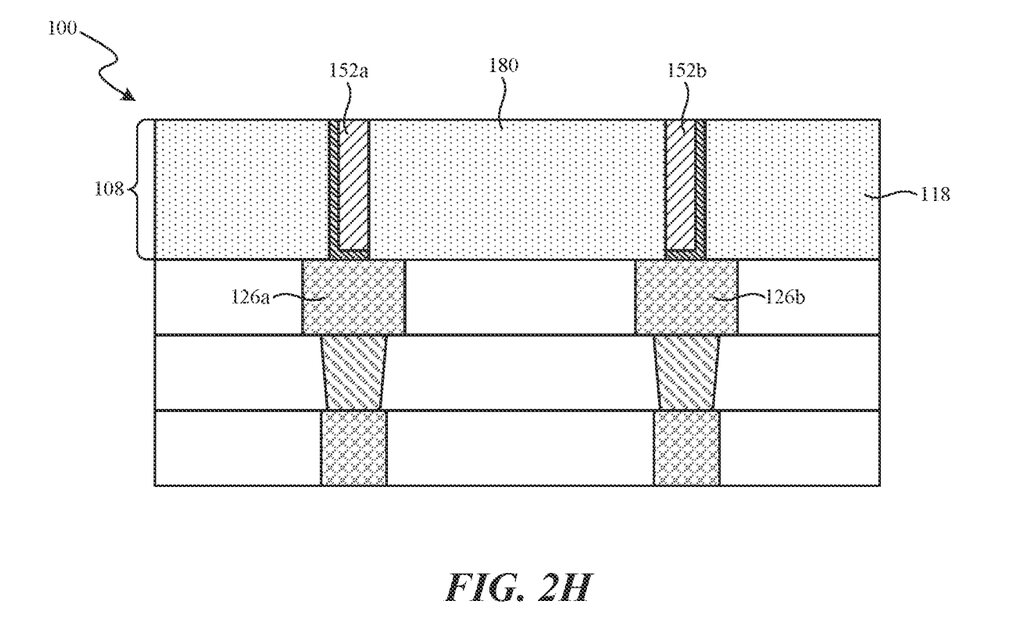

FIGS. 1H and 2H illustrate the semiconductor device 100 after removing the under layer 160 (FIGS. 1G and 2H) and depositing a fifth insulative material 180 into (i) the openings 130 (FIGS. 1E and 2E) previously filled with the under layer 160 and (ii) the channels 170 (FIGS. 1G and 2G). The fifth insulative material 180 can be deposited via a spin-on process or another suitable deposition process. In some embodiments, the fifth insulative material 180 is the same material as the fourth insulative material 118, such as TEOS. Accordingly, after depositing the fifth insulative material 180, each of the via portions 152 (i) extends through and is surrounded by the fourth and fifth insulative materials 118, 180 and (ii) is electrically coupled to a corresponding one of the second conductive features 126.

In some embodiments, the semiconductor device 100 can be planarized after deposition of the fifth insulative material 180. In some embodiments, a metallization layer can subsequently be formed over the fourth layer 108. The metallization layer can include, for example, metal lines (e.g., word and/or bit lines) or other conductive features electrically coupled to corresponding ones of the via portions 152. Accordingly, the via portions 152 can comprise conductive vias electrically coupling the second conductive features 126 to a metallization layer over the fourth layer 108.

In some aspects of the present technology, the conductive via portions 152 can be formed through the fourth layer 108 at a lower cost and/or with higher margin than conventional techniques for forming conductive vias. For example, with reference to FIGS. 1A-2H together, the openings 130 are significantly larger than the subsequently formed via portions 152. That is, the aspect ratio of the openings 130 is less than the aspect ratio of the subsequently formed via portions 152. Accordingly, the openings 130 can be formed with an etching or other process that is less precise—and thus more reliable and lower cost—than conventional methods that etch high aspect ratio holes that correspond to the subsequent dimensions of the conductive vias formed therein. In additional aspects of the present technology, the thickness T of the conductive via portions 152 can be precisely controlled and made arbitrarily small via the deposition technique used to deposit the seed layer 136 and the metal layer 138.

Figure 3:
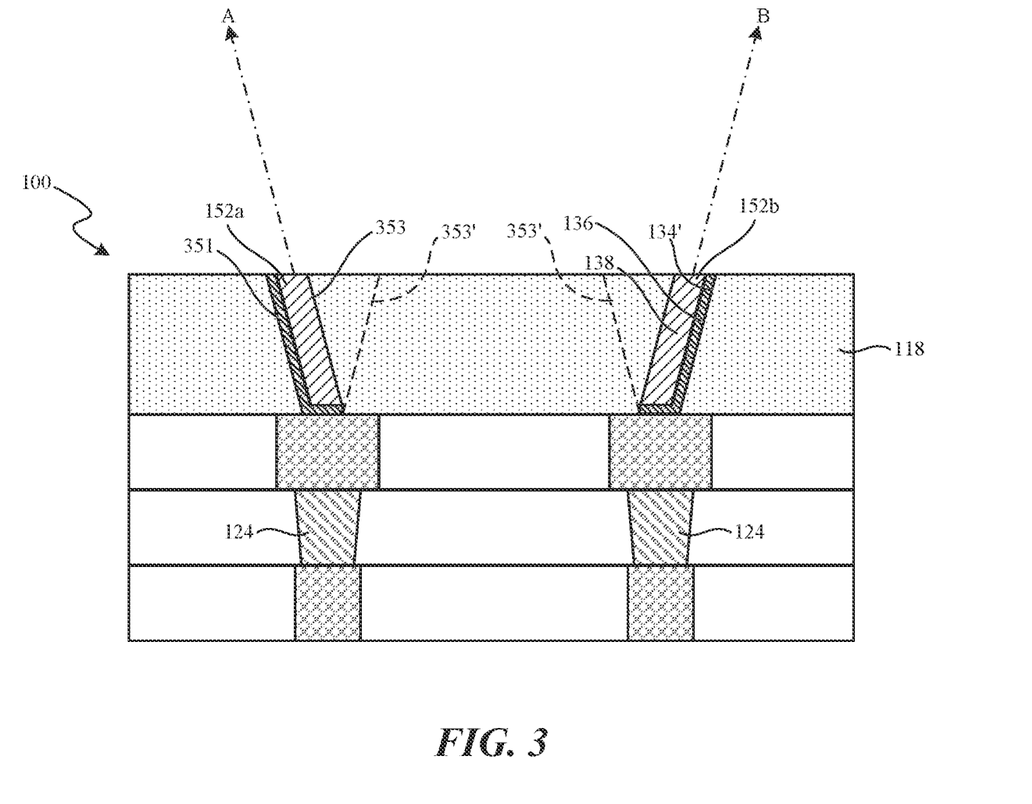
FIG. 3 is an enlarged side cross-sectional view of the semiconductor device of FIGS. 1A-1H taken along the line 2H-2H shown in FIG. 1H in accordance with additional embodiments of the present technology.

Referring again to FIG. 2B, in some embodiments the etching process used to form the openings 130 can result in the sidewall 134' of the fourth insulative material 118 being angled. FIG. 3 is an enlarged side cross-sectional view of the semiconductor device 100 taken along the line 2H-2H shown in FIG. 1H and illustrating the conductive via portions 152 formed along the angled sidewall 134' in accordance with additional embodiments of the present technology. In the illustrated embodiment, the conductive via portions 152 extend generally parallel to the sidewall 134' because, for example, the seed layer 136 and the metal layer 138 are directly deposited onto the sidewall 134' (e.g., as shown in FIGS. 1C and 2C). Moreover, each of the via portions 152 can include a first sidewall 351 and a second sidewall 353 opposite the first sidewall 351 and extending generally parallel to the first sidewall 351.

In contrast, conductive vias formed conventionally by etching high-aspect ratio holes typically include sidewalls that are slanted relative to one another (e.g., similar to the conductive vias 124 and/or as shown in dashed lines with reference to a sidewall 353')—as the conductive vias are formed in the entire etched hole rather than on a single side of the hole. Because the conductive via portions 152 of the present technology are formed in the same first opening 130a (FIGS. 1B and 2B; e.g., on opposite sides of the same first opening 130a), the first and second sidewalls 351, 353 can extend generally parallel to one another despite the angling of the sidewall 134'. Moreover, because the via portions 152 are formed on opposite sides of the same one of the openings 130, the conductive portions 152 in each of the openings 130 can slant in different directions. In the illustrated embodiment, for example, the first via portion 152a is angled along a first axis A and the second via portion 152b is angled along a second axis B extending in a different (e.g., opposite) direction as the first axis A.

In other embodiments, methods in accordance with the present technology can be used to form one, or more than one, conductive via in an opening formed in an insulative material over conductive contacts or lines. For example, with reference to FIGS. 1A-2H together, the second one of the second conductive features 126b could be omitted from the third layer 106, but the fabrication process could proceed similarly to form the first opening 130a, deposit the seed and metal layers 136,138, and so on. Therefore, the second via portion 152b can be formed over a portion of the insulative third layer 106 and, in some embodiments, can subsequently be removed (e.g., as part of the removal process shown in FIGS. 1G and 2G or a separate removal process). Accordingly, the first via portion 152a can be formed to have the same high aspect ratio and with the same advantages as described above without requiring the simultaneous formation of a conductive via over an adjacent or nearby one of the second conductive features 126b.

Similarly, the openings 130 can be formed over more than one of the second conductive contacts 126 (e.g., more than two). In some such embodiments, one or both of the connecting portions 154 of the rings 150 can be formed to conductively contact a corresponding one of the conductive contacts 126. Then, the via portions 152 and the connecting portions 154 can be electrically disconnected using one or more etching/removal processes. In some embodiments, channels can be etched in different (e.g., orthogonal) directions to electrically isolate the via portions 152 and the connecting portions 154.

Figure 4:
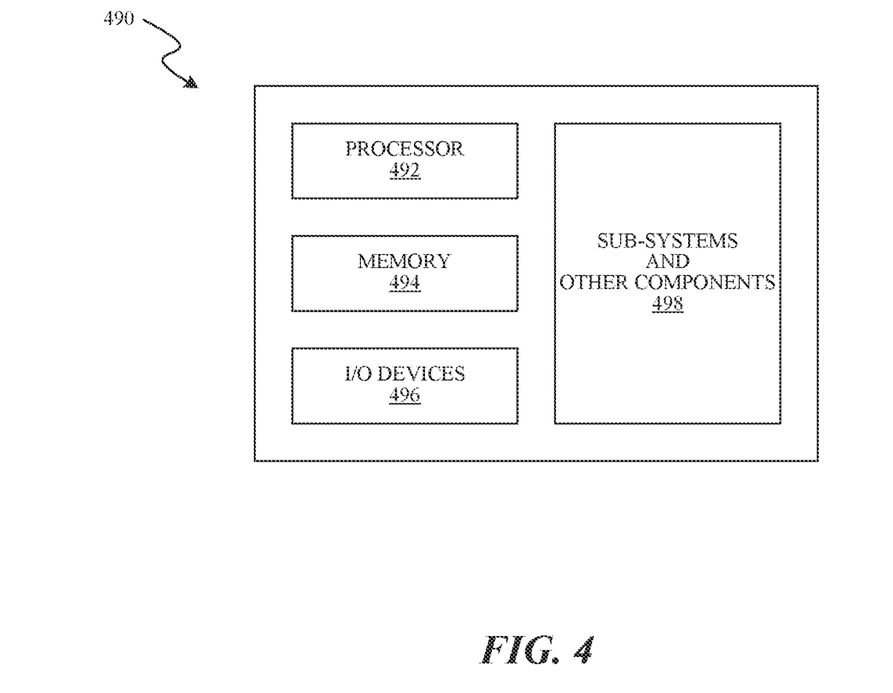
FIG. 4 is a schematic view of a system that includes a semiconductor device in accordance with embodiments of the present technology.

The semiconductor device 100 described in detail above with reference to FIGS. 1A-3 and/or packages incorporating the semiconductor device 100 can be incorporated into any of a myriad of larger and/or more complex systems, a representative example of which is system 490 shown schematically in FIG. 4. The system 490 can include a processor 492, a memory 494 (e.g., SRAM, DRAM, flash, and/or other memory devices), input/output devices 496, and/or other subsystems or components 498. The memory devices and/or packages described above with reference to FIGS. 1A-3 can be included in any of the elements shown in FIG. 4. The resulting system 490 can be configured to perform any of a wide variety of suitable computing, processing, storage, sensing, imaging, and/or other functions. Accordingly, representative examples of the system 490 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multiprocessor systems, processor-based or programmable consumer electronics, network computers, and minicomputers. Additional representative examples of the system 490 include lights, cameras, vehicles, etc. With regard to these and other example, the system 490 can be housed in a single unit or distributed over multiple interconnected units, for example, through a communication network. The components of the system 490 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a first layer of insulative material;
   a second layer of insulative material over the first layer;
   an electrically conductive feature extending through the first layer; and
   an electrically conductive via extending through the second layer and electrically coupled to the electrically conductive feature, wherein the electrically conductive via includes a pair of generally parallel first sidewalls, and wherein the electrically conductive via extends along an axis that is slanted relative to the first layer of insulative material.

2. The semiconductor device of claim 1 wherein the electrically conductive feature has a longitudinal axis that extends orthogonal or parallel to the first layer of insulative material.

3. The semiconductor device of claim 1 wherein the electrically conductive feature is a first electrically conductive feature, and further comprising:
   a third layer of insulative material, wherein the first layer extends over the third layer;
   a fourth layer of insulative material, wherein the third layer extends over the fourth layer;
   a conductive via extending through the third layer; and
   a second conductive feature extending through the fourth layer, wherein the first electrically conductive feature is electrically coupled to the second electrically conductive feature via the conductive via.

4. The semiconductor device of claim 3 wherein the first electrically conductive via comprises a first material, and wherein the second conductive feature comprises a second material different than the first material.

5. The semiconductor device of claim 4 wherein the first material is tungsten, and wherein the second material is copper.

6. A method of manufacturing a semiconductor device, the method comprising:
   forming a ring of electrically conductive material extending about a sidewall defining an opening in an insulative material, wherein the ring of electrically conductive material includes a via portion and a connecting portion extending from the via portion, wherein the via portion is over an electrically conductive feature exposed in the opening, wherein the via portion includes a pair of generally parallel sidewalls, and wherein the via portion extends along an axis that is slanted relative to an upper surface of the electrically conductive feature; and
   removing the connecting portion of the ring of electrically conductive material such that the via portion remains over and electrically coupled to the electrically conductive feature.

7. The method of claim 6 wherein forming the ring of electrically conductive material includes forming the ring of electrically conductive material to have a generally rectilinear cross-sectional shape having (a) a first side opposing a second side and (b) a third side opposing a fourth side, and wherein removing the connecting portion includes removing the second side, the third side, and the fourth side of the ring.

8. The method of claim 6 wherein forming the ring of electrically conductive material includes forming the ring of electrically conductive material to have a generally rectilinear cross-sectional shape having (a) a first side opposing a second side and (b) a third side opposing a fourth side, and wherein removing the connecting portion includes removing the third side and the fourth side of the ring.

9. The method of claim 6 wherein forming the ring of electrically conductive material includes depositing the electrically conductive material onto the sidewall of the insulative material such that the electrically conductive material has a thickness of less than about 10 nanometers.

10. The method of claim 6 wherein the electrically conductive feature is a conductive line extending through an insulative material and electrically coupled to a memory element.

11. The method of claim 6 wherein the via portion is a first via portion, wherein the electrically conductive feature is a second electrically conductive feature, wherein the ring of electrically conductive material further includes a second via portion connected to the first via portion via the connecting portion, wherein the second via portion is over a second electrically conductive feature exposed in the opening, and wherein the removing the connecting portion of the ring of electrically conductive material includes removing the connecting portion such that the second via portion remains over and electrically coupled to the second electrically conductive via portion.

12. The method of claim 11 wherein the axis is a first axis, wherein the second via portion includes a pair of generally parallel sidewalls, and wherein the second via portion extends along a second axis that is slanted relative to an upper surface of the second electrically conductive feature.

13. The method of claim 12 wherein the first axis and the second axis extend in different directions.

14. A method of manufacturing a semiconductor device, the method comprising:
   removing a portion of an insulative material to define an opening at least partially over an electrically conductive feature, wherein the insulative material includes a vertical sidewall at least partially defining the opening, and wherein the vertical sidewall extends orthogonally relative to an upper surface of the electrically conductive feature;
   forming a ring of electrically conductive material extending about the vertical sidewall of the insulative material, wherein the ring of electrically conductive material includes a via portion over the electrically conductive feature and a connecting portion extending from the via portion; and removing the connecting portion of the ring of electrically conductive material such that the via portion remains over and electrically coupled to the electrically conductive feature.

15. The method of claim 14 wherein forming the ring of electrically conductive material includes forming the ring of electrically conductive material to have a generally rectilinear cross-sectional shape having (a) a first side opposing a second side and (b) a third side opposing a fourth side, and wherein removing the connecting portion includes removing the second side, the third side, and the fourth side of the ring.

16. The method of claim 14 wherein forming the ring of electrically conductive material includes forming the ring of electrically conductive material to have a generally rectilinear cross-sectional shape having (a) a first side opposing a second side and (b) a third side opposing a fourth side, and wherein removing the connecting portion includes removing the third side and the fourth side of the ring.

17. The method of claim 14 wherein forming the ring of electrically conductive material includes depositing the electrically conductive material onto the sidewall of the insulative material such that the electrically conductive material has a thickness of less than about 10 nanometers.

18. The method of claim 14 wherein the electrically conductive feature is a conductive line extending through an insulative material and electrically coupled to a memory element.

19. The method of claim 14 wherein forming the ring of electrically conductive material includes forming the via portion to include a pair of generally parallel sidewalls, and wherein the via portion extends along an axis that is slanted relative to an upper surface of the electrically conductive feature.

20. The method of claim 14 wherein forming the ring of electrically conductive material includes—
   depositing a layer of the electrically conductive material in the opening over (a) the vertical sidewall and (b) an insulative layer having the electrically conductive feature therein; and
   removing the electrically conductive material over the insulative layer.

* * * * *